United States Patent [19]
Occhiello et al.

[11] Patent Number: 5,279,853
[45] Date of Patent: Jan. 18, 1994

[54] PROCESS FOR COATING, WITH INORGANIC FILMS, THE SURFACE OF BODIES FABRICATED FROM POLYMERIC MATERIALS

[75] Inventors: Ernesto Occhiello, Novara; Marco Morra, Cortiglione; Fabio Garbassi, Novara, all of Italy

[73] Assignee: Istituto Guido Donegani S.P.A., Novara, Italy

[21] Appl. No.: 811,968

[22] Filed: Dec. 23, 1991

[30] Foreign Application Priority Data

Dec. 24, 1990 [IT] Italy .................. 22539 A/90

[51] Int. Cl.$^5$ .................. C23C 14/10; B05D 5/06
[52] U.S. Cl. .................. 427/162; 427/164; 427/255.1; 427/255.3
[58] Field of Search .............. 427/248.1, 255.1, 255.3, 427/162, 164

[56] References Cited

U.S. PATENT DOCUMENTS

| | | | |
|---|---|---|---|
| 2,920,002 | 1/1960 | Auwarter | 427/166 |
| 3,645,779 | 2/1972 | Kienel | 427/567 |
| 3,811,753 | 5/1974 | Onoki et al. | 427/164 |
| 3,953,652 | 4/1976 | Addiss, Jr. et al. | 428/412 |
| 3,991,234 | 11/1976 | Chang et al. | 427/164 |
| 4,702,963 | 10/1987 | Phillips et al. | 428/426 |
| 4,720,401 | 1/1988 | Ho et al. | 427/250 |
| 5,084,356 | 1/1992 | Deak et al. | 428/458 |

FOREIGN PATENT DOCUMENTS 62-156943 7/1987 Japan .

OTHER PUBLICATIONS

Hackh's Chemical Dictionary, 4th Edition, McGraw Hill Book Company 1969 pp. 298-299.

Primary Examiner—Michael Lusignan
Assistant Examiner—Bret Chen
Attorney, Agent, or Firm—Oblon, Spivak, McClelland, Maier & Neustadt

[57] ABSTRACT

A process for coating the surface of bodies fabricated from polymeric materials with inorganic films by depositing on the polymeric bodies a thin layer obtained by thermal evaporation, under vacuum, of glass/silicon mixtures. The process provides for improved control of surface-depending properties, such as wettability, haze resistance, gas and weight barrier properties and selective absorption of ultraviolet light.

8 Claims, 2 Drawing Sheets

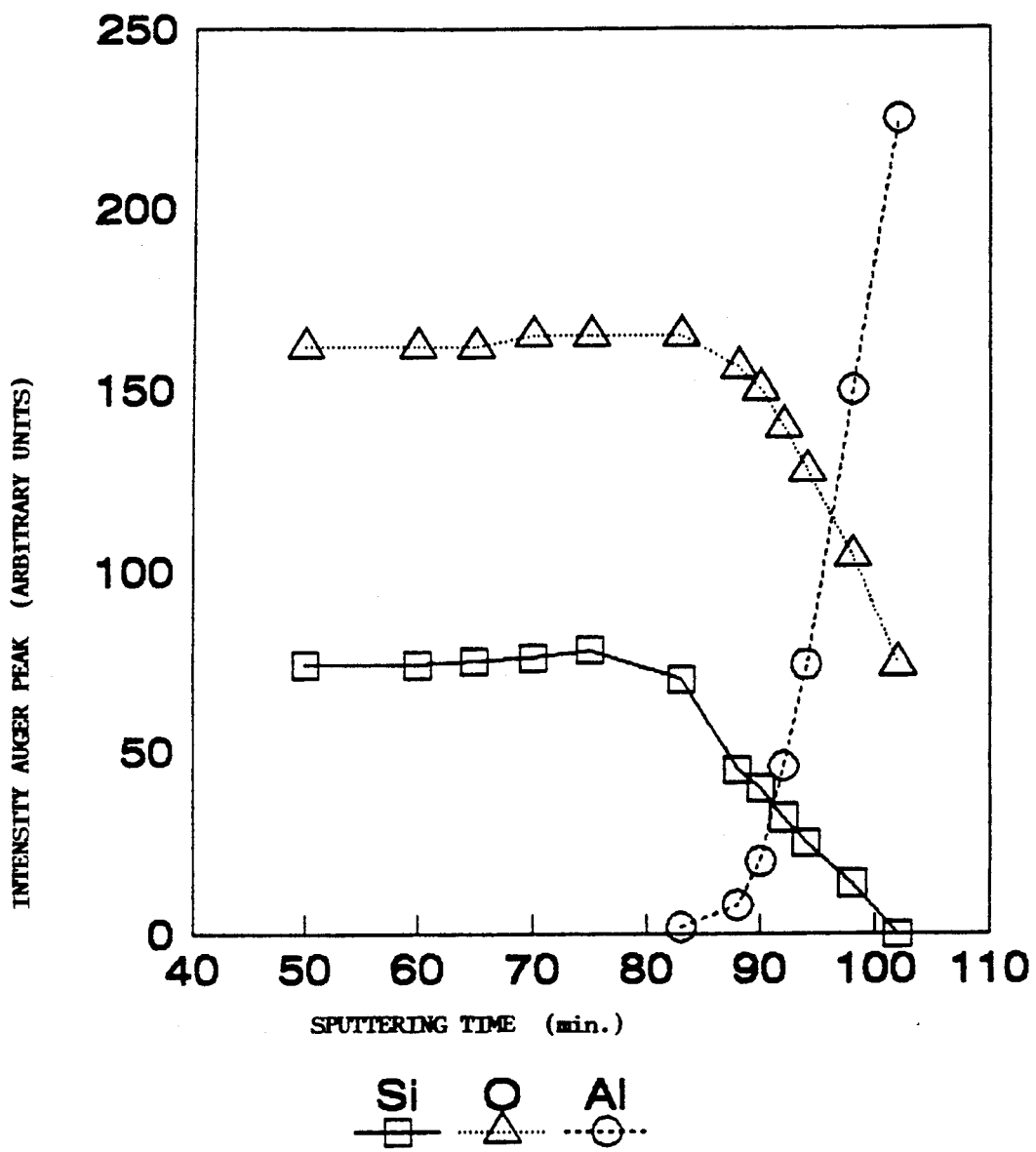

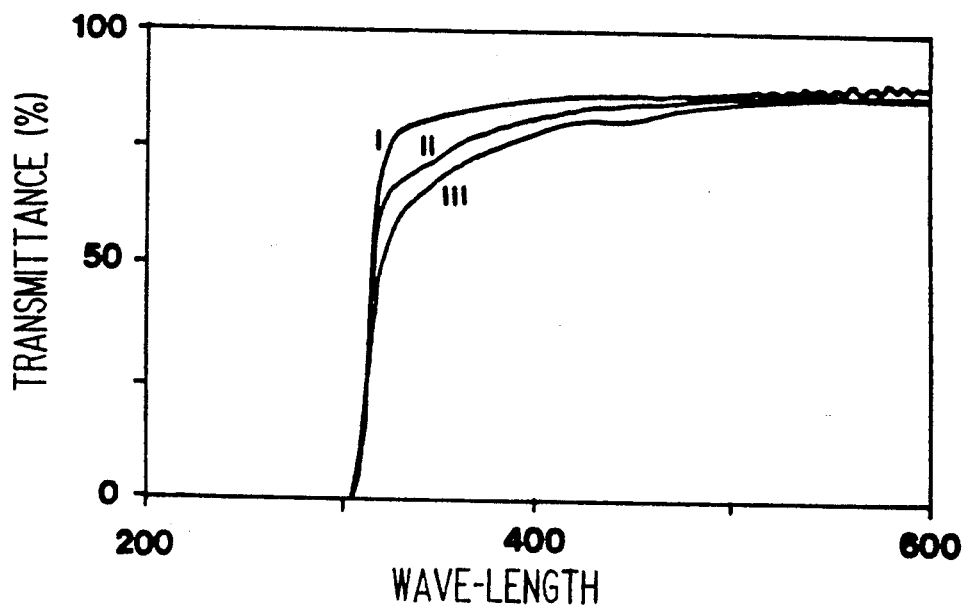
Fig. 2-a
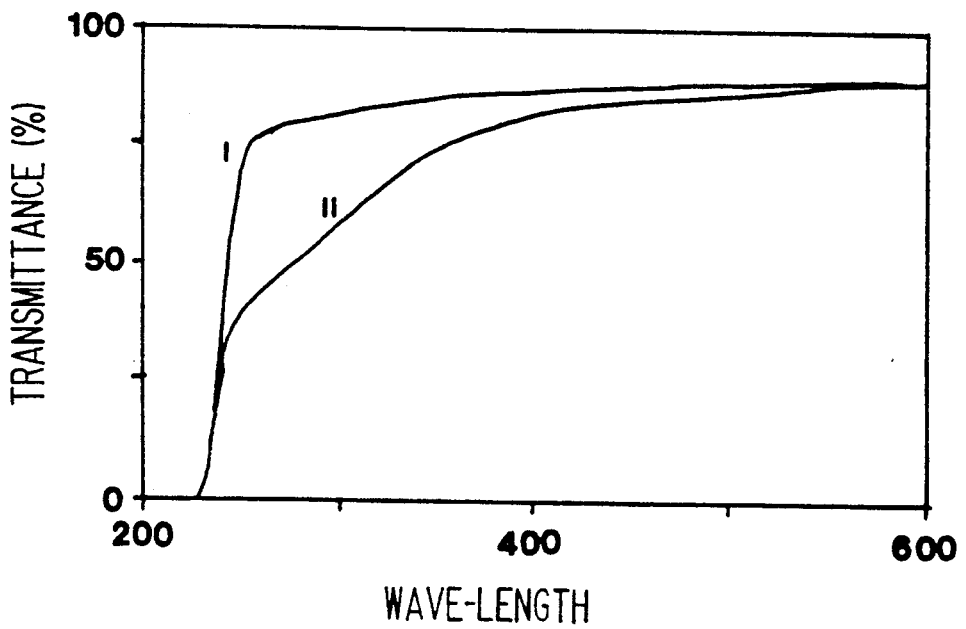
Fig. 2-b

PROCESS FOR COATING, WITH INORGANIC FILMS, THE SURFACE OF BODIES FABRICATED FROM POLYMERIC MATERIALS

The present invention relates to a process for coating the surface of bodies fabricated from a polymeric material with inorganic films.

More particularly, the present invention relates to a process for coating the surface of bodies fabricated from a polymeric material, with inorganic films, by evaporating glass/silicon mixtures.

By the term "bodies fabricated from a polymeric material", as used in the present disclosure and in the appended claims, reference is made to articles of any shapes and sizes obtained by means of such thermoplastic polymers processing techniques, known from the prior art, as, for example, extrusion, injection moulding, "blow-molding", "roto-molding", and so forth. Examples of bodies fabricated according to the present invention are films, sheets, plates, containers, and so forth, obtained from such polymers as polyolefins, such as low-, medium- or high-density polyethylene or polypropylene, polystyrenes, poly(vinyl chloride), polyesters, such as PET [poly(ethylene terephthalate)] or PET [poly(butylene terephthalate)], polycarbonates, polyamides, polymethacrylates, or mixtures thereof, and so forth.

It is known from the prior art that such characteristics as wettability, haze resistance, gas and vapor barrier and selective absorption of ultraviolet light, can be conferred by depositing inorganic layers on the surface of the bodies fabricated from polymeric materials, by means of vacuum technologies. Examples of such technologies are reported in the volume entitled "Thin Film Processes", edited by J. L. Vossen and W. Kern, published by Academic Press, New York, 1978.

It is furthermore known that, among vacuum deposition techniques, thermal evaporation is preferred, due to its high deposition rate and to the very low industrial costs of treatment. The process for depositing inorganic oxide layers on the surface of bodies fabricated from polymeric materials, by means of evaporation, has been disclosed in U.S. Pat. No. 3,442,686, wherein the use is several oxides, among which SiO, $SiO_2$, $Al_2O_3$, $ZrO_2$ and iron oxides may be mentioned, is disclosed.

More recently, in Japanese Patent Application publication No. 62-23 744, the evaporation of glass on products fabricated from polymeric materials, in particular polyester films and bottles, has been described.

Finally, in English Patent Application No. 2 211 516, the process for depositing mixtures of silicon and silicon oxide on thermoplastic films, by means of vacuum evaporation, is disclosed.

In the prior art, as cited hereinabove, there is disclosed that better gas barrier characteristics can be obtained by means of the deposition of inorganic surface layers, and later references (e.g., published Japanese Patent Application No. 60-210 641) disclose that better characteristics of haze resistance are obtained by means of deposition of silicon oxide-based layers, or (Japanese Patent Application publication No. 50-51 180) obtaining better wettability characteristics.

Finally, the trend of optical and barrier properties as a function of the ratio of oxygen to silicon, of silicon oxide-based layers, has been reported in a paper presented by T.G. Krug and K. Ruebsam at the Barrier Pack Conference, London, May 21-22, 1990. In this paper it is reported that optimum property combinations are obtained with an oxygen to silicon ratio comprised within the range of from 1.5 to 1.8.

In none of the above mentioned texts, the use is of silicon-and-glass-based mixtures is disclosed as compositions to be evaporated in order to obtain the coatings endowed with the above described properties.

On the contrary, the present Applicant, has now found that the use of such mixtures allows, as disclosed in the references cited hereinabove, surface-depending properties, such as wettability, haze resistance, gas and vapor barrier properties and selective absorption of ultraviolet light, to be controlled. Further, surprising and substantial increases in deposition rate are additionally observed, with the possibility of using two low cost, easily available materials, i.e., glass and silicon, thus being a further advantage.

Accordingly, the object of the present invention is a process for coating the surface of bodies fabricated from a polymeric material with inorganic films, which process comprises depositing, on said surface, a thin layer, obtained by means of thermal evaporation, under vacuum, of glass/silicon mixtures with a glass:silicon weight ratio comprised within the range of from 1:0.25 to 1:8, in the molten state.

According to a preferred form of the process of the present invention, the glass/silicon weight ratio is comprised within the range of from 1:0.5 to 1:4 or, still more preferably, of from 1:0.5 to 1:1.25. The evaporation is thus carried out in the presence of an excess of silicon, as referred to glass, with the purpose of compensating for the oxidative effects due to the presence of oxidizing components in the residual atmosphere contained in said vacuum environment.

More in particular, the sequence of physical and chemical events, which takes place according to the present process, can be summarized as follows:
i) glass and silicon are melted, inside a vacuum chamber, in order to obtain a homogeneous molten mass;
ii) silicon-(IV) and silicon-(0) are reacted to essentially yield silicon-(II) oxide, as described in "The Oxide Handbook" by G.V. Samsonov, published by IFI/Plenum, New York 1973, page 364;
iii) silicon-(0), silicon-(II) oxide and other possible glass-component oxides are evaporated;
iv) the oxides (iii) are (partially) oxidized in vapour phase, by the residual oxygen present in the vacuum chamber, to substantially yield SiO ; and
v) the vapours are deposited onto the article fabricated from a polymeric material, to yield a layer having a thickness comprised within the range of from 1 to 1,000 nm.

The mixture to be applied by evaporation is constituted by glass and silicon. It is possible to use a common bottle glass, or also glasses generally known with "Pyrex". As regards to silicon, a particular purity is not absolutely necessary, for example silicon known as "metallurgical grade silicon" can be used.

Furthermore, a preliminary, particularly accurate, grinding of the components is not necessary, because glass and silicon melting yields a homogeneous reaction mixture. The melting process is accomplished in a melting pot consisting of conductive, high temperature-resistant material (such as, for example, graphite, tungsten, tantalum, and so forth). Through said melting pot, a current is caused to flow, the value of which is sufficient to cause the reaction mixture to melt (melting by Joule effect).

The use of glass rather than of crystalline silicon oxides allows the molten mixture to be obtained at melting temperatures, which are approximately 800°-1000° C. lower than silica melting temperature, as taught, for example, by E.B. Shand in "Glass Engineering Handbook", published by McGraw-Hill, New York, 1958 gage no. 12. This allows, first of all, silicon-(IV) oxide melting to be achieved at a temperature compatible with silicon melting temperature, thus enabling a much better homogenization of the reaction mixture, and a considerable energy saving to be obtained.

In addition, a control of the chemistry of the layer can be carried out, first of all, by operating on the glass to silicon weight ratio, which leads to values of the molar ratio of silicon-(IV) to silicon-(0) comprised within the range of from 0.05 to 1.7, or also to values of the molar ratio of oxygen to silicon comprised within the optimal range of from 0.1 to 1.5. A second way to control the chemistry of the layer, consists in modifying the value of reaction environment pressure value because the higher said pressure value, the larger will be the amount of residual oxygen and water vapour which can react in the gas phase with the evaporated substances.

Optimum pressure values in order to carry out the process of the present invention, are values comprised within the range of from $10^{-5}$ to 1 Pa, and preferably comprised within the range of from $10^{-3}$ to $10^{-1}$ Pa.

The deposited inorganic surface layer has a thickness comprised within the range of from 1 to 1000 nm, preferably comprised within the range of from 5 to 150 nm, according to the planned applicator). In fact, from the prior art, it is well-known that, for applications in which the deposited layer should perform the function of gas barrier, thickness values higher than 40 nm are preferred, as reported by T.G. Krug and K. Ruebsam in the hereinabove cited publication. It is furthermore known that the properties connected with wettability depend on the first molecular layer of each material, as taught by W.A. Zisman in a paper published on "Advances in Chemistry Series", Volume no. 43, published by American Chemical Society, Washington, 1964, pages 6-7. Anyway, in order to secure the continuity of the deposited layer, for such applications, a layer having a thickness of at least 5 nm is preferable, whilst its chemical composition will be such that the value of O/Si ratio is comprised within the range of from 1.5 to 1.8, because such a range, as reported by T.G. Krug and K. Ruebsam, allows an optimum compromise to be obtained between the different properties given by the coating.

The process object of the present invention allows deposition rates to be obtained which depend on the used equipment, with such rates being in general higher than 3 nm/s, for example being comprised within the range of from 3 to 100 nm/s, and said process is particularly suitable for treating articles to be used in the field of food packing.

In such a field a coating layer having both gas and vapor barrier properties, in particular oxygen barrier properties, and better wettability or ultraviolet light barrier properties, is very important.

Another merchandise field in which the present process can be advantageously used, is the field of coatings for greenhouses and agricultural cultivations wherein, preventing the appearance of haze, which prevents sun light from reading the cultivations, is particularly important.

Therefore, a further object of the present invention are the bodies fabricated from polymeric material, which have been modified by means of the present process, and the use of such modified bodies in all those fields wherein gas and vapor barrier properties or ultraviolet light barrier properties, a high wettability level and a high haze resistance, are requested.

BRIEF DESCRIPTION OF THE DRAWINGS

FIG. 1 is an Auger spectrum of the silicon and oxygen layer produced by the present invention.

FIG. 2-a is a UV and visible light spectra comparing non-treated PET and PET coated with the inorganic layer.

FIG. 2-b is a UV and visible light spectra comparing non-treated polyamide-6 and coated polyamide-6.

In order to better understand the present invention and to supply examples of practical embodiment thereof, in the following some examples are reported for illustrative, and non-limitative purposes.

In all the examples reported, a vacuum chamber having a cylindrical shape, has been used, with said chamber, manufactured by Kenotec of Binasco [(MI), Italy], having an inner diameter of about 40 cm and a height value of 30 cm. The accomplishment of vacuum inside the reactor is secured by a pumping device capable of reaching pressure values of the order of $10^{-5}$ Pa. Melting pots of standard size (50×10×0.15 mm, made from tantalum), provided by Goodfellow, Cambridge, U.K. were used. The evaporation was excited by converting an alternating current (at 50 Hz) from 220 V to 6 V (frequency 50 Hz, intensity 100 A), by means of a transformer supplied by Elettromeccanica Verbano, Novara, Italy.

COMPARATIVE EXAMPLE

The evaporation characteristics have been compared of some oxide mixtures, as suggested in the prior art, in particular, silicon-(II) oxide, silicon/silicon-(IV) oxide and glass mixtures.

Silicon-(II) oxide and silicon-(IV) oxide were purchased from Aldrich Chemical, Milwakee, Wisconsin, U.S.A.. Common glass for chemical glassware was purchased from Schott, Mainz, Germany.

For all evaporation processes, the vacuum chamber and the current source hereinabove described, were used. The pressure value inside the vacuum chamber was maintained at $3 \times 10^{-2}$ Pa. The oxide mixtures were charged to tantalum melting pots, of 50×10×0.15 mm of size, with such melting pots being positioned at a distance of 125 mm from the sample; such a sample consisted of aluminum sheets or double-orientated PET films (Melinex 800, thickness value of 12 micrometres, provided by ICI, WILTON, U.K.). To the melting pots, in all the cases, the oxides were charged, in such amounts to obtain a total number of gram-atoms of $4.92 \times 10^{-3}$.

First of all, the deposition rate of different oxide mixtures, under the same experimental conditions, was studied. The deposition rate was measured by means of a quartz microbalance, model IL100, manufactured by Intellemetrics, Clydebank, U.K., by introducing the values of density and acoustical impedance Of $SiO_2$, as they were supplied by the manufacturer of the instrument. The different geometrical position relatively to the sample, and possible differences deriving from the chemical composition of the deposited layer, were compensated for by means of a calibration by Auger Profile, according to the following procedure (such a procedure was obviously repeated for the several types of evaporated materials):

a deposition on aluminum was carried out, with the thickness value read by the quartz microbalance being simultaneously recorded;

the coated aluminum sample was submitted to the testing for Auger Profile (according to the method as described by J. M. Morabito and R. K. Lewis in "Methods of surface analysis", edited by A. W. Czanderna, published by Elsevier, Amsterdam 1975, pages 279-328) by means of a spectrometer XPS-AES PHI 548, manufactured by Perkin Elmer, Eden Prairie, Minnesota, USA, with also the latter being previously calibrated by means of standards consisting of $Si_3N_4$ layers on Si, having a known thickness value;

the thickness values obtained by means of the Auger Profile were compared to those obtained by means of the quartz microbalance. The further conversion into deposition rate values was carried out, and the compensation by means of calibration was used for subsequent experiments.

In Table 1 the deposition rate values are reported, which were obtained for different kinds of evaporated material.

TABLE 1

| Evaporated material | Deposition Rate (nm/s) |
| --- | --- |
| SiO | 1.0 |
| Glass | 0.8 |
| Si/SiO₂ 1:1 | 2.6 |

The deposition processes carried out with the hereinabove cited oxides were repeated on polymeric substrates, in particular on PET films, and the resulting samples were analysed by means of electronic X-ray spectrometry (XPS, a method described in "Practical surface York, 1983, pages 359-396), by means of the hereinabove cited instrument, in order to obtain such values of O/Si ratio, as reported in Table 2.

TABLE 2

| Evaporated material | Thickness (nm) | XPS O/Si |
| --- | --- | --- |
| SiO | 25 | 1.5 |
| Glass | 12 | 2.1 |
| 1:1 Si/SiO₂ | 90 | 1.3 |

EXAMPLE 1

Evaporation processes were carried out on glass/silicon mixtures, with various values of the mutual ratio of the components. The glass cited in the above Comparative Example 1 was used; on the other hand, silicon was supplied by Monsanto Electronic Materials Company, Novara, Italy.

The experimental procedures cited in the Comparative Example were retained; in particular, the number of gram-atoms, charged to the melting pot at each evaporation process, was kept constant, and equal to the value specified hereinabove.

The evaporation rate values were determined as reported in the Comparative Example, i.e., by jointly using a quartz microbalance and Auger Profiles. In Table 3, the obtained evaporation rate values are reported, with such values being, as one may see, considerably higher than those as reported in Table 1.

TABLE 3

| Weight ratio of glass/silicon | Molar ratio of O/Si | Deposition rate (nm/s) |
| --- | --- | --- |
| 1:0.25 | 1.36 | 3.2 |
| 1:0.5 | 0.99 | 3.1 |
| 1:0.75 | 0.78 | 4.5 |
| 1:1 | 0.64 | 4.5 |
| 1:2 | 0.38 | 3.7 |
| 1:4 | 0.21 | 4.5 |
| 1:8 | 0.11 | 3.5 |

Some samples obtained in that way were analyzed by XPS, according to the method as described in Comparative Example 1, and the so obtained values of molar O/Si ratio are reported in Table 4.

TABLE 4

| Weight ratio of glass/silicon | Molar ratio of O/Si (by XPS) |
| --- | --- |
| 1:0.5 | 1.8 |
| 1:1 | 1.7 |
| 1:4 | 1.3 |
| 1:8 | 1.2 |

A sample was subsequently prepared by depositing a layer from a glass/silicon mixture in the ratio of 1:1, and said sample was then submitted to chemical analysis by Auger Profile. Aluminum was selected as the substrate, in that the technique requires a conductive substrate, but, as those skilled in the art are well aware of, such a substrate does in no way influence the chemistry of the surface layer. The result is reported in FIG. 1, from which one can see that the intensity of the peaks relevant to silicon and oxygen is not variable up to the nearby of the interface. Such a trend evidences a constant chemical composition of the deposited layer.

EXAMPLE 2

Samples for wettability measurements were prepared by evaporating the mixtures described in Comparative Example and in Example 1, with thicknesses variables within the range of from 5 to 300 nm, being applied. The hereinabove cited PET films, as well as films of mono-orientated polyamide-6 (thickness value of 18 micrometers, manufactured by Fapack, Pisticci, Italy) and of low-density polyethylene (thickness value of 50 micrometers, fabricated from Eraclene QG 6015, manufactured by Enimont Materials, Milan, Italy), were used as substrates.

The advancing contact angles (a.a.) and receding angles (r.a.) for water were then measured by means of a contact angles measuring instrument manufactured by Ramé-Hart (Mountain Lakes, New Jersey, U.S.A.). The sessile drop method, according to the procedures as taught by S. Wu in "Polymer Interface and Adhesion", published by Marcel Dekker, New York 1982, pages 257-260, was used.

The observed advancing angle values relevant to the component with the lowest surface wettability as reported by S. Wu in the hereinabove paper, were comprised within the range of from 0° and 30°. On the contrary, the receding angle values relevant to the component with the highest surface wettability, resulted to be comprised within the range of from 0° and 10°. A dependence from the substrate, from the value of O/Si ratio or from the thickness value of the deposited layer, was not observed, with such a dependence, on the contrary, being observed as regards storage conditions, relative humidity and so forth. Such observations are in accordance with the behavior of the contact angles values on inorganic oxide surface, as discussed by S. Wu in the hereinabove cited paper, pages 224-228.

The contact angles of water on non-treated substrates are those reported in Table 5. It can be observed that the treatment causes a drastic increase in wettability characteristics of the surfaces.

TABLE 5

| Material | Advancing Angle (°) | Receding Angle (°) |
|---|---|---|
| PET | 78 | 41 |
| PA | 52 | 13 |
| LDPE | 96 | 78 |

EXAMPLE 3

Samples for measurements of adhesion of coating to substrate were prepared by using the PET films hereinabove identified as the substrate, under the evaporation conditions disclosed in Example 1, with values of the weight ratio of glass/silicon and of thickness, as reported in detail in Table 6.

The values of adhesion of the coating to the polymeric film, was evaluated by means of the tearing strength test. An experimental system designated Sebastian II, supplied by Quad Group of Spokane, Washington, USA), was used. Such a system consists, first of all, of aluminum punches coated with an epoxy adhesive, which was caused to adhere to the coated surface. The film was then anchored, in its turn, with its non-treated side, to a metallic support. Sebastian II instrument is also capable of exerting an increasing tensile stress, up to cohesive or adhesive breakage of the joint.

As reported in Table 6, with the non-treated sample an adhesive breakage occurred, i.e., the metallic punch became detached from the film. With all treated samples, on the other hand contrary, the film tearing occurred, i.e., a cohesive breakage resulted. This involves two, both positive, distinct effects. The first of them is an increase in adhesion of the film surface with the adhesives, i.e., an increase in the adhesion strength of the treated films as compared to the adhesion strength of the non-treated ones. The second effect, is due to the fact that the interface between inorganic coating and deposited layer results to be particularly strong, so as to originate a cohesive breakage of the polymeric film.

TABLE 6

| Weight ratio glass/silicon | Thickness (nm) | Type of failure |
|---|---|---|
| Untreated PET | — | adhesive |
| 1:0.5 | 39 | cohesive |
| 1:0.5 | 126 | cohesive |
| 1:1 | 99 | cohesive |
| 1:1 | 150 | cohesive |
| 1:1 | 205 | cohesive |
| 1:2 | 54 | cohesive |
| 1:2 | 169 | cohesive |

EXAMPLE 4

The 1:1 glass/silicon mixture, which enables high deposition rate values to be achieved, was used to deposit (according to the procedures reported in Example 1) inorganic layers on PET, polyamide-6 and low-density polyethylene films, as described in Example 2.

The effect on haze resistance of such a treatment, was then evaluated by means of the experimental apparatus as disclosed in the following. The polymeric material (film supported by means of a frame), was positioned at a distance of 20 cm in height, above a crystallizer inside which an amount of water was caused to boil. The angle formed by the line perpendicular to the support plane and the line perpendicular to the film plane, had a value of about 60°. The film was lighted on the one side thereof, by a variable-intensity lamp. On the other side an optical fibre was positioned, which brought the transmitted light to a multichannel spectrum analyzer. The radiation comprised within the range of wave lengths of from 254 to 840 nm was collected, and the spectrum thereof was transmitted to a computer which carried out the integration of the signal, that is, the count of the transmitted photons. The measurements of the transmitted light amount were carried out when the $H_2O$ reached an high boiling rate, and the amount of water vapour present was such as to homogeneously impinge onto the polymeric surface. For each measurement session 5 spectra were recorded, with an exposure time of 1 second, at time intervals of 30 seconds from each other. The measurement result was expressed (as percent value) as the average number of photons transmitted in the 5 recorded spectra; such an average number was then compared to the number of photons transmitted in the absence of water vapour. The resulting values are reported in Table 7. From said table, it clearly appears that substantial improvements were obtained as regard wettability and haze resistance characteristics, which did not noticeably depend on the thickness of the deposited layer.

TABLE 7

| Material | Thickness (nm) | Haze Resistance |
|---|---|---|
| PET | — | 65 |
|  | 37 | 96 |
|  | 94 | 96 |
|  | 70 | 95 |
| PA | — | 78 |
|  | 39 | 94 |
|  | 84 | 95 |
|  | 280 | 94 |
| LDPE | — | 51 |
|  | 168 | 98 |

EXAMPLE 5

The 1:1 glass/silicon mixture, which allows high deposition rate values to be obtained, was used to deposit (according to the procedures reported in Example 1) inorganic layers on PET, polyamide-6 and low-density polyethylene films as described in Example 2.

The UV and visible light spectra (200-600 nm) were collected by means of a spectrometer, model UV-160, manufactured by Shimadzu, Japan.

In FIG. 2-a, the spectra are reported, which relate to non-treated PET (line "I") and PET coated with a layer having a thickness value of 72 nm (line "II") and 148 nm (line "III"). In FIG. 2-b, to the contrary, the spectra relating to non-treated polyamide-6 (line "I") and polyamide-6 coated with a layer having a thickness value of 280 nm (line "II"), are reported.

It results evident that, in the case of treated films, the transmission values result to be decreased at wave length values shorter than 400 nm, such a decrease being a function of the thickness value of the applied layer.

We claim:

1. A process for coating the surface of bodies fabricated from polymeric materials, with inorganic films, which process comprises depositing, on said surface, an inorganic layer obtained by thermal evaporation, under vacuum, of a mixture consisting essentially of glass/silicon with a glass:silicon weight ratio within the range of from 1:0.25 to 1:8, in the molten state, wherein the thermal evaporation is carried out under a pressure within the range of from $10^{-5}$ to 1 Pa.

2. A process according to claim 1, wherein the glass/silicon weight ratio is within the range of from 1:0.5 to 1:4.

3. A process according to claim 1 or 2, wherein the molten silicon/glass mixture is at a temperature about 800°–1000° C. lower than the melting temperature of silica.

4. A process according to claim 1 or 2, wherein the inorganic layer has a thickness within the range of from 1 to 1000 nm.

5. A process according to claim 1 or 2, wherein the deposition of the inorganic films takes place at a rate higher than 3 nm/s.

6. A process according to claim 2, wherein the glass/silicon weight ratio is from 1:0.5 to 1:1.25.

7. A process according to claim 1, wherein the pressure is within the range of from $10^{-3}$ to $10^{-1}$ Pa.

8. A process according to claim 4, wherein the inorganic layer has a thickness within the range of from 5 to 150 nm.

* * * * *